(12) United States Patent
Clark

(10) Patent No.: US 9,923,545 B2
(45) Date of Patent: Mar. 20, 2018

(54) COMPOUND SPRING MEMS RESONATORS FOR FREQUENCY AND TIMING GENERATION

(71) Applicant: Microchip Technology Incorporated, Chandler, AZ (US)

(72) Inventor: John Ryan Clark, Howell, MI (US)

(73) Assignee: Microchip Technology Incorporated, Chandler, AZ (US)

(*) Notice: Subject to any disclaimer, the term of this patent is extended or adjusted under 35 U.S.C. 154(b) by 197 days.

(21) Appl. No.: 14/883,435

(22) Filed: Oct. 14, 2015

(65) Prior Publication Data
US 2016/0118954 A1 Apr. 28, 2016

Related U.S. Application Data

(60) Provisional application No. 62/067,230, filed on Oct. 22, 2014, provisional application No. 62/067,206, filed on Oct. 22, 2014.

(51) Int. Cl.
*H02N 1/08* (2006.01)
*H03H 9/24* (2006.01)
(Continued)

(52) U.S. Cl.
CPC .......... *H03H 9/2405* (2013.01); *H02N 1/008* (2013.01); *H03H 9/02244* (2013.01);
(Continued)

(58) Field of Classification Search
CPC ............. H03H 9/2405; H03H 9/02244; H03H 9/02259; H03H 9/02362; H03H 9/02377;
(Continued)

(56) References Cited

U.S. PATENT DOCUMENTS 5,025,346 A 6/1991 Tang et al.
5,450,751 A 9/1995 Putty
(Continued)

FOREIGN PATENT DOCUMENTS

EP 1519197 3/2005
EP 2403139 1/2012
(Continued)

OTHER PUBLICATIONS

Yan J et al., "Suppression of parasitic resonance in piezoresistively transduced longitudinal mode MEMS resonators", Ultrasonics Symposium (IUS), 2009 IEEE International, IEEE, Piscataway, NJ, USA, Sep. 20, 2009 (Sep. 20, 2009), pp. 2149-2152, XP031654478, ISBN: 978-1-4244-4389-5 section II, first paragraph: p. 1249-p. 1250; figures 2,4.
(Continued)

*Primary Examiner* — Edgardo San Martin
(74) *Attorney, Agent, or Firm* — Innovation Counsel LLP

(57) ABSTRACT

A compound spring MEMS resonator includes a resonator body constructed using one or more spring unit cells forming a compound spring block and one or more compound spring blocks forming the resonator body. Each compound spring block is anchored at nodal points to ensure a high quality factor. The resonator body further includes masses attached to the open ends of the compound spring block and capacitively coupled to drive/sense electrodes. The dimensions of the spring unit cells, the number of spring unit cells for a compound spring block, the size and weight of the masses, and the length and width of the support beams are selected to realize a desired resonant frequency. Meanwhile, the number of compound spring blocks is selected to tune the desired electrical characteristics, such as impedance, of the MEMS resonator.

20 Claims, 12 Drawing Sheets

(51) Int. Cl.
*H02N 1/00* (2006.01)
*H03H 9/02* (2006.01)

(52) U.S. Cl.
CPC ......... *H03H 9/2452* (2013.01); *H03H 9/2431* (2013.01); *H03H 2009/0233* (2013.01); *H03H 2009/02251* (2013.01); *H03H 2009/02283* (2013.01); *H03H 2009/02307* (2013.01); *H03H 2009/02496* (2013.01)

(58) Field of Classification Search
CPC ........... H03H 9/2452; H03H 2009/241; H03H 2009/02251; H03H 2009/0233; H03H 2009/02496; H03H 2009/0237; H03H 2009/02283; H03H 2009/02307; H02N 1/008
USPC ......................................................... 310/300
See application file for complete search history.

(56) References Cited

U.S. PATENT DOCUMENTS

| | | | |
|---|---|---|---|
| 5,537,083 A * | 7/1996 | Lin | H03H 9/02275 333/186 |
| 5,589,082 A * | 12/1996 | Lin | H03H 9/02275 216/11 |
| 5,767,405 A | 6/1998 | Bernstein et al. | |
| 5,864,064 A | 1/1999 | Kano | |
| 6,236,281 B1 * | 5/2001 | Nguyen | G01R 33/0286 331/116 M |
| 6,401,536 B1 | 6/2002 | O'Brien | |
| 6,630,871 B2 | 10/2003 | Ma et al. | |
| 6,686,807 B1 | 2/2004 | Giousouf | |
| 7,023,065 B2 | 4/2006 | Ayazi | |
| 7,211,909 B2 | 5/2007 | Schindler | |
| 7,211,926 B2 | 5/2007 | Quevy et al. | |
| 7,252,002 B2 | 8/2007 | Zerbini et al. | |
| 7,495,199 B2 * | 2/2009 | Jankowiak | G01J 5/46 250/200 |
| 7,517,711 B2 | 4/2009 | Naniwada | |
| 7,591,201 B1 * | 9/2009 | Bernstein | H03H 3/0076 74/2 |
| 7,839,239 B2 | 11/2010 | Sworowski et al. | |
| 7,893,595 B2 * | 2/2011 | Kaiser | H03H 9/02417 310/309 |
| 7,908,922 B2 | 3/2011 | Zarabadi | |
| 8,013,493 B2 * | 9/2011 | Van Der Avoort | H03H 9/02244 310/309 |
| 8,390,387 B2 * | 3/2013 | Lander | H03H 3/0076 310/321 |
| 8,570,112 B2 | 10/2013 | Yamakawa et al. | |
| 8,627,726 B2 * | 1/2014 | Phan Le | G01L 9/0022 73/727 |
| 8,669,822 B2 * | 3/2014 | Lander | H03H 3/0072 29/25.35 |
| 8,803,624 B2 | 8/2014 | Phan Le | |
| 8,854,149 B2 | 10/2014 | Li et al. | |
| 9,412,934 B2 * | 8/2016 | Iihola | H01L 41/39 |
| 9,584,092 B2 * | 2/2017 | Engelen | H02N 11/00 |
| 2006/0114541 A1 | 6/2006 | Van Beek | |
| 2009/0140356 A1 | 6/2009 | Yazdi | |
| 2009/0219113 A1 | 9/2009 | Kaiser et al. | |
| 2011/0210801 A1 * | 9/2011 | Rottenberg | G01K 7/32 331/156 |
| 2011/0215877 A1 * | 9/2011 | Koning | H03H 9/02448 331/70 |
| 2012/0001700 A1 * | 1/2012 | Lander | H03H 3/0072 331/156 |
| 2012/0262242 A1 * | 10/2012 | van der Avoort | H03H 9/02338 331/154 |
| 2014/0266509 A1 | 9/2014 | Caffee et al. | |
| 2016/0118954 A1 | 4/2016 | Clark | |

FOREIGN PATENT DOCUMENTS

| | | | |
|---|---|---|---|
| EP | 2515436 | 10/2012 | |
| WO | WO 2016064677 | 4/2016 | |
| WO | WO 2016064678 A1 * | 4/2016 | H02N 1/008 |

OTHER PUBLICATIONS

Bontemps J J M et al., "56 MHZ piezoresistive micromechanical oscillator", Solid-State Sensors, Actuators and Microsystems Conference 2009. Transducers 2009. International, IEEE, Piscataway, NJ, USA, Jun. 21, 2009 (Jun. 21, 2009), pp. 1433-1436, XP031545723, ISBN: 978-1-4244-4190-9, figure 1; table 1.

* cited by examiner

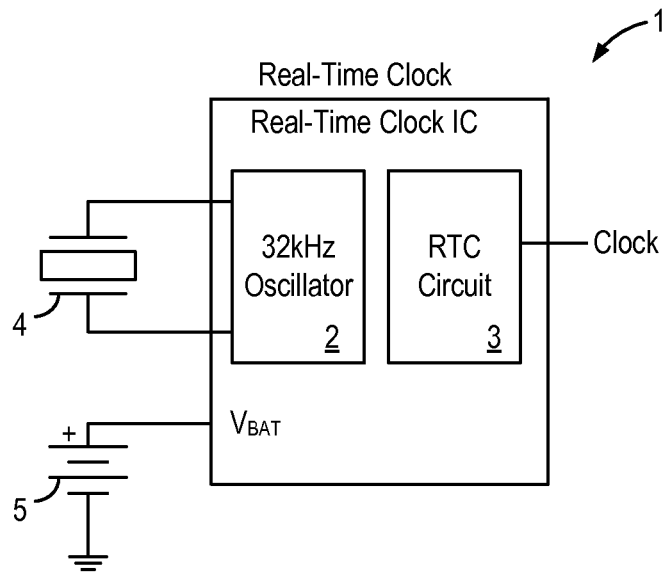
Fig. 1(a)
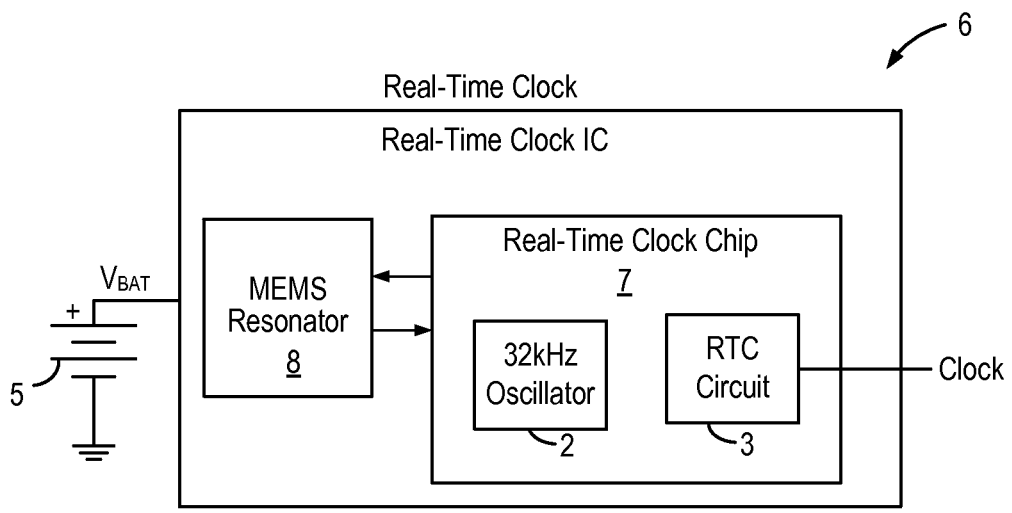
Fig. 1(b)
Fig. 1 (Prior Art)

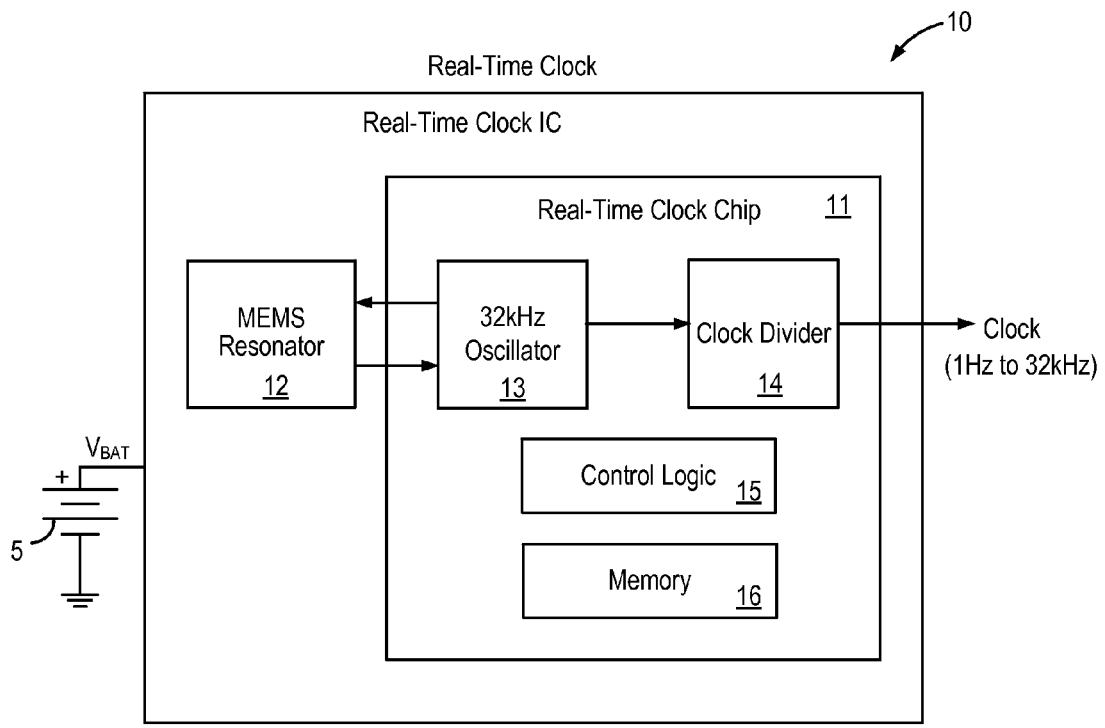
Fig. 2(a)
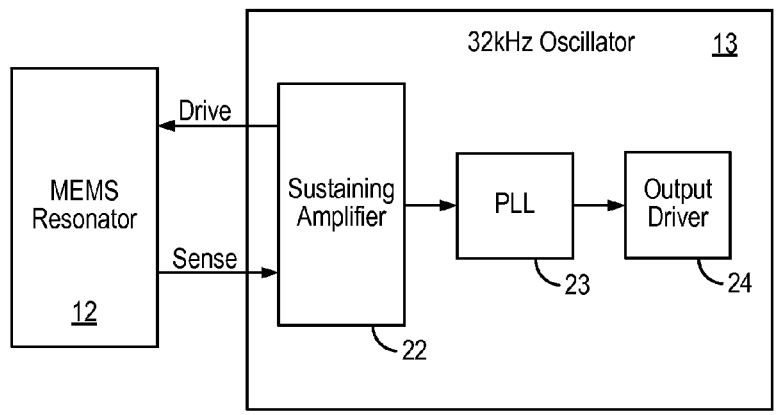
Fig. 2(b)
Fig. 2

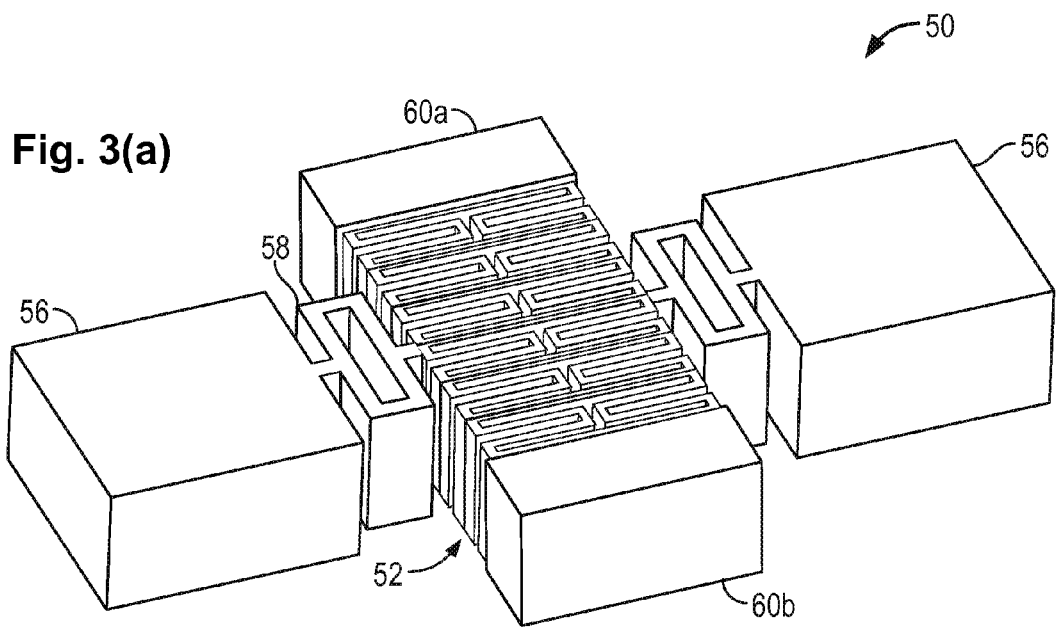
Fig. 3(a)
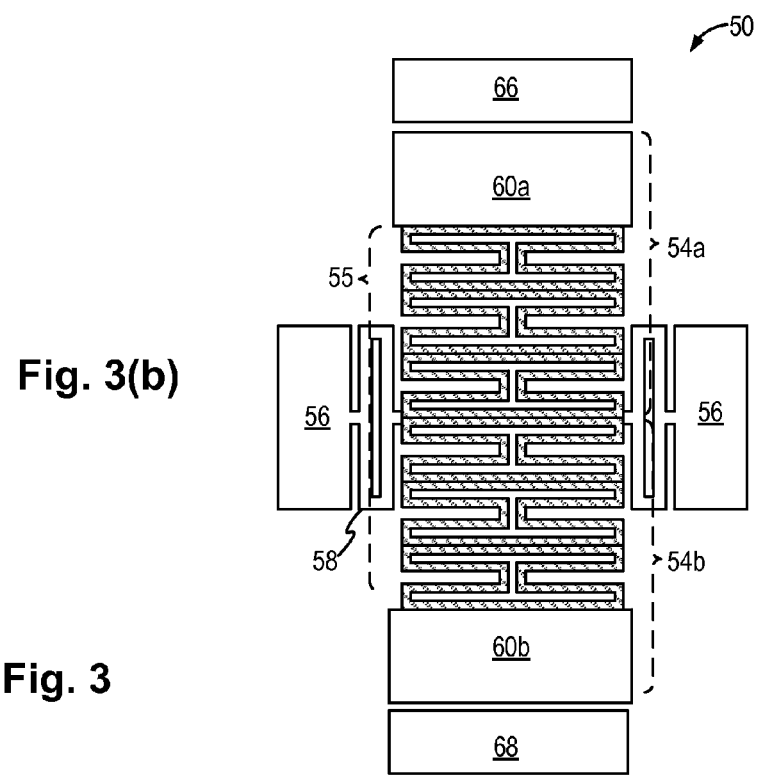
Fig. 3(b)
Fig. 3

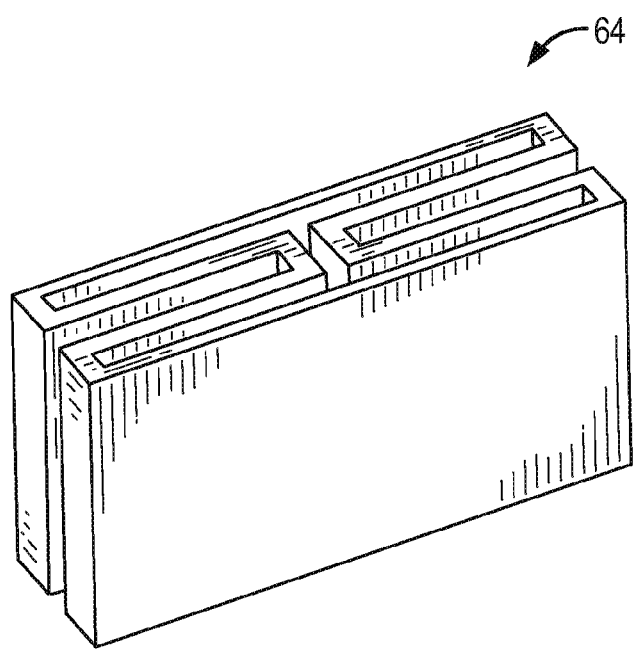
Fig. 4(a)
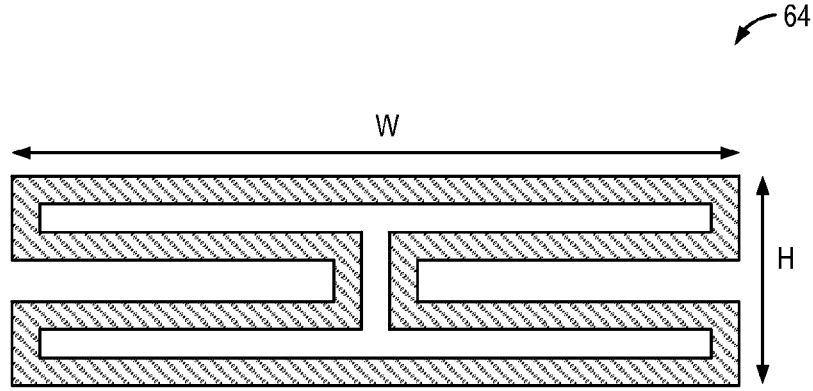
Fig. 4(b)
Fig. 4

Fig. 14(a)
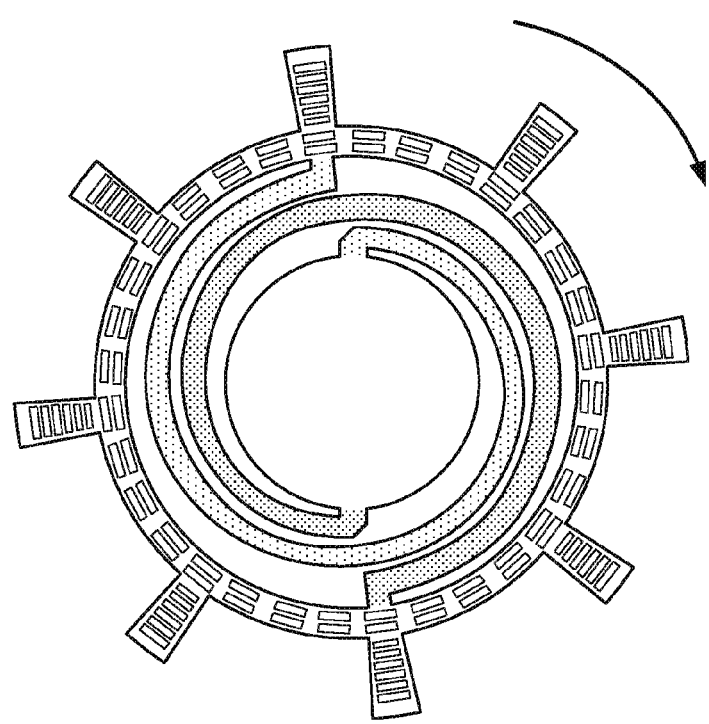
Fig. 14(b)
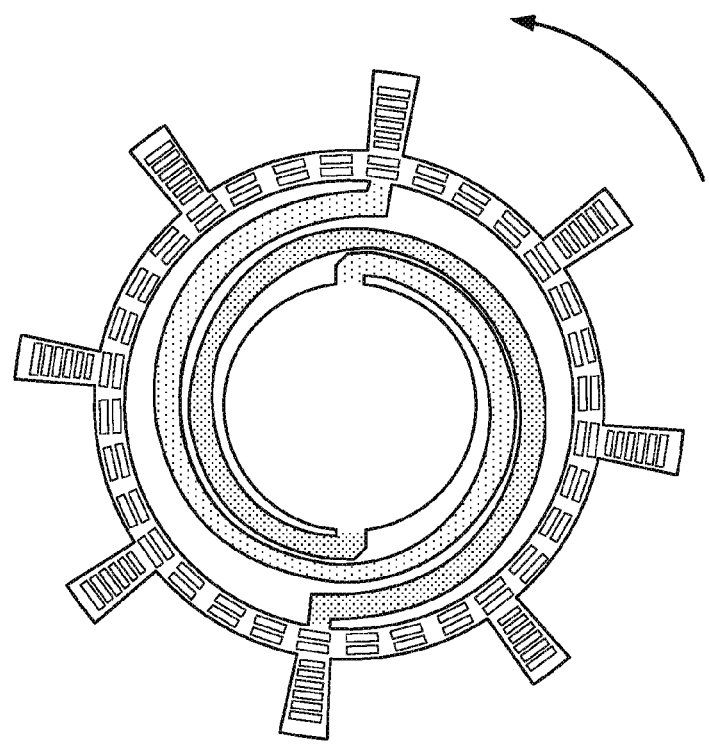
Fig. 14

COMPOUND SPRING MEMS RESONATORS FOR FREQUENCY AND TIMING GENERATION

CROSS REFERENCE TO OTHER APPLICATIONS

This application claims priority to U.S. Provisional Patent Application No. 62/067,230 entitled MULTIPLE COIL SPRING RESONATORS, filed Oct. 22, 2014, which is incorporated herein by reference for all purposes.

This application also claims priority to U.S. Provisional Patent Application No. 62/067,206 entitled COMPOUND SPRING RESONATORS FOR FREQUENCY AND TIMING GENERATION, filed Oct. 22, 2014, which is incorporated herein by reference for all purposes.

BACKGROUND OF THE INVENTION

MEMS (microelectromechanical systems) resonators are small electromechanical structures that vibrate at precise frequencies. MEMS resonators are useful in electronic circuits for providing timing references and frequency references. In typical applications, a MEMS resonator is attached to an electronic circuit to form an oscillator circuit. A MEMS oscillator includes a MEMS resonator driven by a sustaining amplifier in continuous motion. The mechanical resonant vibration of the MEMS resonator is sensed and converted into an electrical signal with a very precise frequency. The precise MEMS resonant frequency is used as the reference frequency for the oscillator circuit. The electronic circuit attached to the MEMS resonator amplifies the sensed electrical signal and sets or adjusts the output frequency of the oscillator based on the MEMS resonant frequency. For example, the electronic circuit may include a phase-locked loop (PLL) or a frequency-locked loop that generates programmable output frequencies based on the MEMS resonant frequency as the reference frequency.

Common applications for MEMS oscillators include real-time clocks. A real-time clock (RTC) is a computer clock, often in the form of an integrated circuit, used to keep track of the current time in electronic systems, such as computers, servers and consumer electronic devices. FIG. 1, which includes FIGS. 1(a) and 1(b), illustrates conventional real-time clock circuits. Referring to FIG. 1(a), a real-time clock 1, often provided as a real-time clock integrated circuit, includes an oscillator circuit 2 and supporting circuitry (RTC circuit) 3. Traditional real-time clocks use a crystal oscillator circuit that uses the mechanical resonance of a vibrating quartz crystal 4 to provide the desired reference frequency. The quartz crystal 4, a discrete component outside of the real-time clock integrated circuit, is driven to resonate at a desired frequency, such as 32.768 kHz. The oscillator circuit 2 turns the vibration of the quartz crystal 4 into an electrical signal with the desired precise frequency (e.g. 32.768 kHz). The RTC circuit 3 provides signal amplification, clock division, and other time keeping functions. The real-time clock 1 often includes an alternate power source 5 so that the real-time clock can continue to keep time while the primary source of power is off or becomes unavailable. The alternate power source 5 can be a battery power source, such as a lithium ion battery or a supercapacitor.

Because quartz crystal is bulky and does not integrate well with semiconductor integrated circuits, MEMS resonators have become an attractive alternative to the traditional quartz crystal in constructing oscillator circuits. Referring to FIG. 1(b), a real-time clock 6 is formed using a real-time clock integrated circuit that includes a real-time clock chip 7 and a mems resonator 8, which can be co-packaged within the same integrated circuit package, such as, but not limited to, a quad flat no-leads package (QFN) or a land grid array package (LGA). The MEMS resonator 8 provides a precise reference frequency. The real-time clock chip 7 houses all of the supporting circuitry, including the oscillator circuit 2 and the RTC circuit 3. With the MEMS resonator thus integrated, the size of the real-time clock is reduced. Furthermore, MEMS resonator provide additional benefits such as more consistent stability over a wider temperature range and better resistance to environmental factors such as shock and vibration.

BRIEF DESCRIPTION OF THE DRAWINGS

Various embodiments of the invention are disclosed in the following detailed description and the accompanying drawings.

FIG. 1, which includes FIGS. 1(a) and 1(b), illustrates conventional real-time clock circuits.

FIG. 2, which includes FIGS. 2(a) and 2(b), illustrates a real-time clock circuit and a MEMS oscillator circuit incorporating the MEMS resonator of the present invention in some embodiments.

FIG. 3, which includes FIGS. 3(a) and 3(b), includes a perspective view and a top view of a compound spring MEMS resonator in embodiments of the present invention.

FIG. 4, which includes FIGS. 4(a) and 4(b), includes a perspective view and a top view of a spring unit cell in embodiments of the present invention.

FIGS. 8(a) to 8(c), illustrates the harmonic motion of the MEMS resonator of FIG. 6 in some examples.

FIG. 14, which includes FIGS. 14(a) to 14(b), illustrates the harmonic motion of the MEMS resonator of FIG. 10 in some examples.

DETAILED DESCRIPTION

Figure 5:
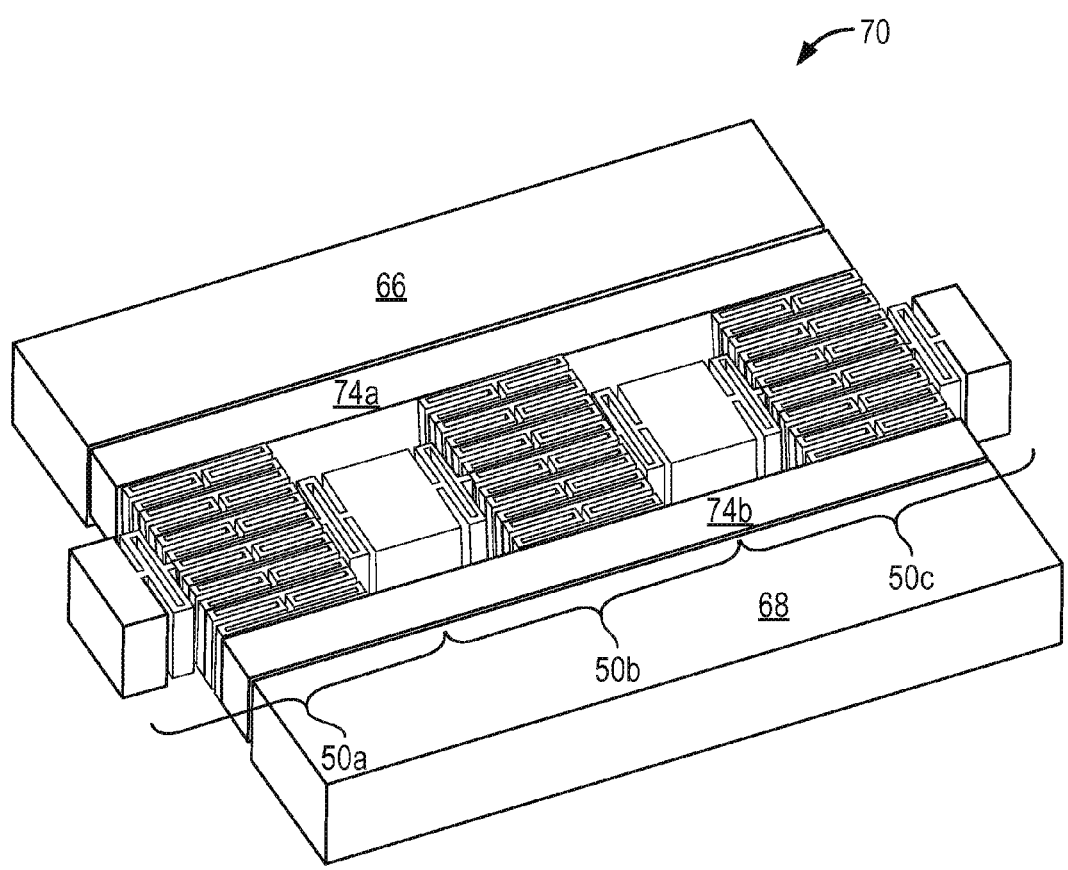
FIG. 5 is a perspective diagram of a compound spring MEMS resonator including multiple resonator units in embodiments of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a compound spring MEMS resonator includes a resonator body constructed using one or more spring unit cells forming a compound spring block and one or more compound spring blocks forming the resonator body. Each compound spring block is anchored at nodal points to ensure a high quality (Q) factor. The resonator body further includes masses attached to the open ends of the compound spring block and capacitively coupled to drive/sense electrodes. The dimensions of the spring unit cell, including the length and width of the beams forming the spring unit cell, the number of spring unit cells for a compound spring block and the size and weight of the masses are selected to realize a desired resonant frequency. Meanwhile, the number of compound spring blocks and the aforementioned dimensional and configuration factors are selected to tune the desired electrical characteristics, such as impedance, of the MEMS resonator.

According to other embodiments of the present invention, a multiple coil spring MEMS resonator includes a center anchor and a resonator body including two or more coil springs extending in a spiral pattern from the center anchor to an outer closed ring. Each pair of coil springs originates from opposing points on the center anchor and extends in the spiral pattern to opposing points on the outer ring. The number of coil springs, the length and the width of the coil springs, and the weight of the outer ring are selected to realize the desired resonant frequency.

In the present description, a MEMS resonator refers to a small electromechanical structure that vibrates at a stable and precise resonant frequency. In embodiments of the present invention, the MEMS resonator is a silicon spring-mass system which can be excited into mechanical resonant vibration. A MEMS resonator is driven by a sustaining amplifier to vibrate in continuous oscillation to generate an output frequency. In particular, the sustaining amplifier detects the resonator motion and drives additional energy into the resonator while maintaining the resonator motion at desired amplitudes. The resonant vibration is sensed and converted into an electrical signal having the resonant frequency of the resonator. The MEMS resonator has applications in forming MEMS oscillators and real-time clocks.

The MEMS resonators of the present invention realize many advantages over conventional MEMS resonators. First, the MEMS resonators of the present invention are optimized for low frequency vibration. Conventional MEMS resonators configured for low frequency operation typically require a large resonator body size. In embodiments of the present invention, the compound spring and coil spring MEMS resonators minimize the physical size of the resonator body while optimizing the resonator for low frequency output. Meanwhile, the MEMS resonators of the present invention are capable of realizing low motional impedance which is a critical parameter in oscillator or real-time clock application.

Second, the compound spring MEMS resonator formed using stacked spring unit cells realizes low stiffness while maintaining good mechanical stability in a compact area. The compound spring MEMS resonator of the present invention is stable in operation with predictable temperature behavior and achieves a high quality factor.

Lastly, the multiple coil spring resonator is anchored to the substrate in the center. By using only a single center anchor, the resonance frequency of the multiple coil spring resonator is less sensitive to substrate or package stress. The multiple coil spring resonator of the present invention therefore also achieves stability in operation with a high quality factor.

In some applications, the MEMS resonators of the present invention are used as a frequency source for an oscillator circuit. In particular, the MEMS resonators of the present invention can be used to provide a stable and accurate reference clock for real-time clock circuits to enable the real-time clocks to maintain accurate time over temperature variations. In one example, the MEMS resonator of the present invention is used to construct a MEMS oscillator providing an output frequency of 32.768 kHz or a multiple of 32.768 kHz which is useful in real-time clock circuits. FIG. 2, which includes FIGS. 2(a) and 2(b), illustrates a real-time clock circuit and a MEMS oscillator circuit incorporating the MEMS resonator of the present invention in some embodiments. Referring to FIG. 2(a), a real-time clock 10, provided as a real-time clock integrated circuit, includes a real-time clock chip 11 and a MEMS resonator 12, either co-packaged in the same integrated circuit or formed on the same semiconductor substrate. The MEMS resonator 12 can be implemented either as the compound spring MEMS resonator or the multiple coil spring MEMS resonator described below. The MEMS resonator 12 provides a precise reference frequency for the oscillator circuit 13 formed on the real-time clock chip 11. For time-based applications, the MEMS resonator 12 is constructed to resonate at 32.768 kHz or at some multiple of 32.768 kHz. For example, in some embodiments, the MEMS resonator 12 is constructed to resonate at 524.288 kHz (16×) or at 262.144 kHz (8×). The phase-locked loop (PLL) of the real-time clock circuit divides down the MEMS resonator frequency to the desired 32.768 kHz frequency. In this manner, the MEMS resonator 12 can be made smaller to reduce cost while the real-time clock can improve noise during the frequency division operation.

The real-time clock chip 11 houses all of the supporting circuitry for the real-time clock 10 to provide signal amplification, clock division, and other time keeping functions. In the present example, the real-time clock chip 11 includes the oscillator circuit 13 providing a stable clock signal, such as at 32.768 kHz. In particular, the oscillator circuit 13 drives the MEMS resonator 12 to generate a sensed signal having the desired reference frequency of 32.768 kHz or a multiple of 32.768 kHz. The oscillator circuit 13 provides a clock signal having the frequency of 32.768 kHz as the reference clock signal. The real-time clock chip 11 further includes a clock divider 14 to generate an output clock signal over a range of frequency based on the reference clock signal. For example, the output clock signal can have a frequency of 1 Hz to 32 kHz. The real-time clock chip 11 further includes control logic circuitry 15 and a memory 16 to provide control and to realize other time base or timekeeping functions. The schematic diagram of the real-time clock 10 shown in FIG. 2(a) is illustrative only and is not intended to be limiting. In actual implementation, the real-time clock 10 may include other circuitry not shown in the example schematic diagram of FIG. 2(a).

The real-time clock 10 often includes an alternate power source 5 so the real-time clock can continue to keep time while the primary source of power is off or becomes unavailable. The alternate power source 5 can be a battery power source, such as a lithium ion battery or a supercapacitor.

FIG. 2(b) illustrates an example construction of a MEMS oscillator in some embodiments. Referring to FIG. 2(b), the MEMS oscillator 13 includes a sustaining amplifier 22 configured to drive the MEMS resonator 12 in continuous motion to generate an output frequency as the reference frequency. The reference frequency is the resonant frequency of the MEMS resonator which is set at 32.768 kHz or a multipole of 32.768 kHz. The MEMS oscillator 13 is further configured to sense the resonant vibration of the MEMS resonator 12. The sense signal is provided to a phase-locked loop (PLL) 23 as the reference frequency. The PLL generates a clock signal at the reference frequency or as a function of the reference frequency. The oscillator circuit 13 may include an output driver 24 to generate the reference clock signal for use by the downstream real-time clock circuitry. In the present example, the reference clock signal has a frequency of 32.768 kHz.

Compound Spring MEMS Resonator

FIG. 3, which includes FIGS. 3(a) and 3(b), includes a perspective view and a top view of a compound spring MEMS resonator in embodiments of the present invention. Referring to FIG. 3, a compound spring MEMS resonator 50 includes a resonator body 52 formed as a pair of connected spring-mass systems 54 that is suspended above a substrate (not shown) and anchored to the substrate through a pair of isolating anchors 56. In particular, the resonator body 52 includes a first spring-mass system 54a ("spring-mass—section 1") and a second spring-mass system 54b ("spring-mass section 2") connected base-to-base and suspended above the substrate such that their relative motions and subsequent stresses cancel at nodal points at which the spring-mass systems 54 are anchored to the substrate through the isolating anchors 56.

In the spring-mass systems 54, each of the spring-mass sections 1, 2 is formed by a spring structure attached at the open end to a mass. In embodiments of the present invention, each of the spring-mass sections 1, 2 is formed using spring unit cells that are stacked to form a compound spring structure. In FIG. 3(b), the MEMS resonator 50 is shown with the spring unit cell structure in a hatch pattern to illustrate the folded spring structure of the spring unit cells. The compound spring structure may include one or more spring unit cells to obtain a desired stiffness of the resonator and therefore to adjust the frequency of the resonator. More specifically, the number of spring unit cells can be selected to realize the desired resonance frequency for the MEMS resonator. The compound spring structures of the spring-mass sections 1, 2 are connected at the base (the nodal point) to form a single compound spring block 55. In spring-mass section 1, the compound spring structure is attached at the open end to a first mass 60a. In spring-mass section 2, the compound spring structure is attached at the open end to a second mass 60b. The size and weight of first and second mass 60a,b are selected to tune or adjust the resonance frequency of the resonator. Furthermore, first and second mass 60a,b function as the input and output electrodes of the MEMS resonator 50 to couple the input drive signal and the output sense signal to/from the resonator body. The input and output electrodes operate through capacitive coupling to enable the spring-mass systems 54 to be electrostatically driven and sensed, as will be explained in more detail below.

In embodiments of the present invention, the spring-mass systems 54 are formed from spring unit cells 64 which are repeated and connected to form the compound spring structures. FIG. 4, which includes FIGS. 4(a) and 4(b), includes a perspective view and a top view of a spring unit cell in embodiments of the present invention. Referring to FIG. 4, a spring unit cell 64 has a compact folded spring structure. In the present example, the spring unit cell 64 has a rectangular folded spring structure. The spring unit cell 64 is designed to enable the folded spring structure to be repeated by stacking to form a compound spring structure. The compound spring structure thus formed minimizes the size of the spring mass system while remaining stable. The compound spring structure formed from stacked spring unit cell is capable of providing low stiffness while maintaining good mechanical stability in a compact area in the MEMS resonator.

In embodiments of the present invention, the resonant frequency of the MEMS resonator 50 is defined by the dimensions of the spring unit cell, that is, the width (W) and the height (H) of the spring unit cell and the length and width of the beams forming the spring unit cell. The resonant frequency of the MEMS resonator 50 is further defined by the number of spring unit cells for a compound spring block and the size and weight of the masses.

Returning to FIGS. 3 and 4, in MEMS resonator 50, the resonator body 52 includes the spring-mass section 1 and spring mass section 2 (54a,b) that are connected base-to-base at the nodal points. The spring-mass sections 1, 2 are anchored to the substrate at the nodal points by anchors 56 through isolating suspension beams 58. That is, the anchors 56 are connected or attached to a substrate (not shown) and the spring-mass sections 1,2 are connected to the anchors 56 at the nodal points through the suspension beams 58. Suspension beams 58 are not attached to the substrate but are suspended above the substrate. In the present description, nodal points refer to points on the resonator body that do not move substantially or have only minimum movement during resonant vibration. By anchoring the spring-mass systems 54 at nodal points, the MEMS resonator can achieve a high quality factor. Each isolating suspension beam 58 connects the compound spring block 55 at the nodal point to the anchor 56. The isolating suspension beam 58 functions to isolate any residual motion or environmental stress from the anchor 56, thereby keeping the vibration energy in the spring-mass system and improving the quality factor of the resonator. In alternate embodiments of the present invention, the suspension beams may be omitted and the anchors 56 may be directly attached to the resonator body at the nodal points.

In some embodiments, the MEMS resonator 50 is formed by patterning and etching a silicon layer having a thickness of 20-30 μm. Thus, the MEMS resonator 50 has a thickness of approximately 20-30 μm. The spring unit cell 64 has a width (W) of 56 μm and a height (H) of 15 μm and is composed of 3 μm wide beams forming the folded spring structure. In the present example, the spring-mass sections 1 and 2 (54a and 54b) are each formed using three spring unit cells. The mass 60*a* and 60*b* each has a dimension of 56 µm by 22 µm. The suspension beam 58 has a dimension of 13 µm by 30 µm. The anchor 56 has a dimension of 30 µm by 30 µm. The resulting resonant frequency of the compound spring resonator is approximately 524 kHz.

In embodiments of the present invention, the MEMS resonator 50 is formed using a conductive material such as polysilicon or single crystalline silicon. Furthermore, in some embodiments, the MEMS resonator of the present invention can be formed using standard CMOS fabrication processes. In some embodiments, the MEMS resonator is formed on a silicon-on-insulator (SOI) wafer. That is, the MEMS resonator is formed in a silicon layer formed on a substrate with an insulating layer formed thereon. For example, in one embodiment, a silicon base layer with 2 µm of silicon oxide formed thereon may be used as the substrate. The silicon layer, which can be a polysilicon layer or single crystalline silicon layer, is formed on the substrate and the silicon layer is patterned to form the MEMS resonator.

In some embodiments, the resonator body, including the spring-mass systems, the suspension beams and the anchors, can be formed by having the resonator structure lithographically patterned on the silicon layer formed on the substrate. In some embodiments, the silicon layer is a single crystalline silicon layer and has a thickness of 20-30 µm. The silicon layer is patterned with the resonator structure, including the spring, the mass, the suspension beams and the anchors. Then, the silicon layer is etched, such as using a wet etch process using hydrofluoric acid, to release the resonator spring and mass structure except the anchors. After the etch process, the resonator body is released from the underlying substrate while the anchors remain attached to the substrate. In some embodiments, release holes can be included in the mass 60*a,b* to facilitate the etching and release of the resonator body from the underlying substrate. The release holes also enable the weight of the mass to be adjusted to tune the resonant frequency of the MEMS resonator, as will be explained in more detail below.

In some embodiments, the MEMS resonator 50 is operated based on electrostatic transduction. The MEMS resonator 50 forms narrow and well controlled gaps with a drive electrode and a sense electrode where the drive/sense electrodes are connected or attached to the substrate, as shown in FIG. 3(*b*). For example, a drive electrode 66 may be capacitively coupled to the mass 60*a* while a sense electrode 68 may be capacitively coupled to the mass 60*b*. The gap between the drive/sense electrode and the mass is typically a small air gap, on the order of 1 µm or less. Through the electrostatic transduced action, the MEMS resonator is driven into resonant vibration. The resonant vibration is sensed and converted into an electrical signal having a well-defined and precise frequency. Note that the resonator structure and the electrodes are symmetrical and therefore the drive and sense electrodes can be interchanged.

In the embodiment shown in FIG. 3 described above, a MEMS resonator including a single compound spring structure in the resonator body is described. As described above, the dimensions of the spring unit cell, including the dimensions of the beams forming the spring unit cell and the number of spring unit cells in the compound spring block are selected to tune the resonant frequency of the MEMS resonator. Furthermore, the size and the weight of the mass at the open ends of the compound spring block are also selected to tune the resonant frequency of the MEMS resonator. In some embodiments, the resonator body of FIG. 3 represents a resonator unit where the resonator unit can be repeated and connected in parallel to form a MEMS resonator having the desired frequency as well as electrical characteristics. In particular, while factors such as the spring unit cell dimensions, the number of spring unit cells in a block and the size and weight of the masses contribute to the effective electrical characteristics of the MEMS resonator, the electrical characteristics of the MEMS resonator can be further adjusted by connecting multiple resonator unit in parallel.

Figure 6:
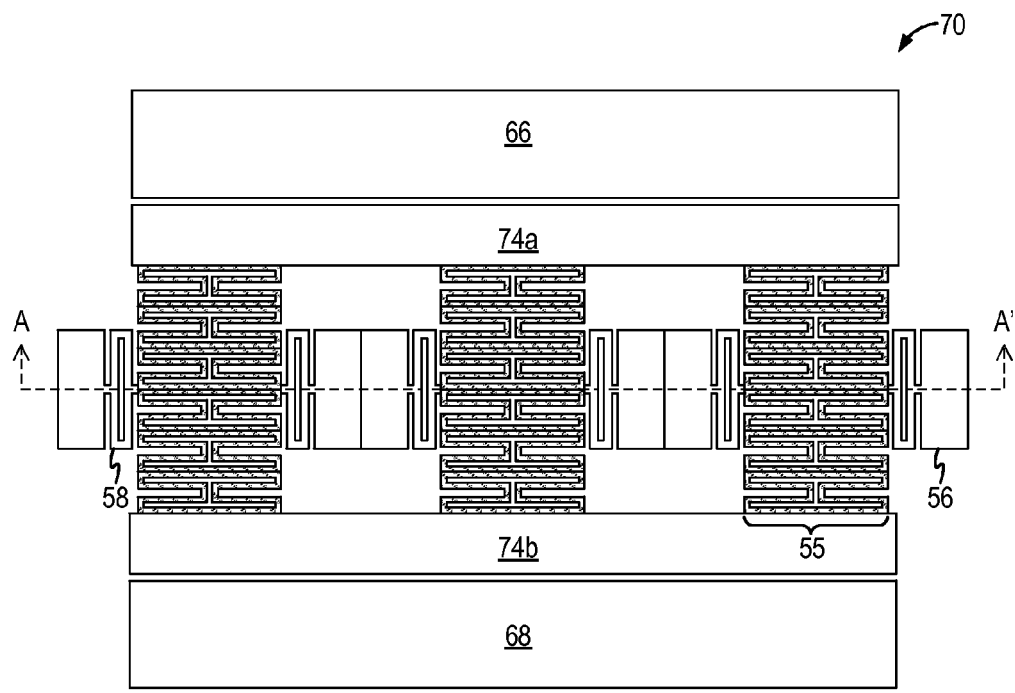
FIG. 6 is a top view of the compound spring MEMS resonator of FIG. 5 in some embodiments.

FIG. 5 is a perspective diagram of a compound spring MEMS resonator including multiple resonator units in embodiments of the present invention. FIG. 6 is a top view of the compound spring MEMS resonator of FIG. 5 in some embodiments. In FIG. 6, the MEMS resonator is shown with the spring unit cell structure in a hatch pattern to illustrate the folded spring structure of the spring unit cells used to form the compound spring block. Referring to FIGS. 5 and 6, a compound spring MEMS resonator 70 is formed using three resonator units 50*a*, 50*b* and 50*c* connected in parallel to form the resonator body. Each resonator unit 50*a-c* is constructed in the same manner as described above with reference to FIG. 3. More specifically, each resonator unit includes a spring-mass section 1 formed from three spring unit cells and a spring-mass section 2 formed from three spring unit cells. The compound spring block for each resonator unit is anchored at the nodal points by the suspension beams and the anchors. The anchors for two adjacent resonator units can be merged into a single anchor.

The mass 74*a* and 74*b* at the open ends of the compound spring blocks are formed as a single continuous or contiguous structure to realize the parallel connection. The mass 74*a* is connected to the open end of spring-mass sections 1 of all the resonator units. The mass 74*b* is connected to the open end of spring-mass sections 2 of all the resonator units. The mass 74*a* is separated from the drive electrode 66 by a narrow air gap to form a capacitor with the drive electrode 66. The mass 74*b* is separated from the sense electrode 68 by a narrow air gap to form a capacitor with the sense electrode 68. The air gap between the drive/sense electrode and the mass is small, typically on the order of 1 µm or less. Note that the resonator structure and the electrodes are symmetrical and therefore the drive and sense electrodes can be interchanged. Furthermore, the drive electrode 66 and the sense electrode 68 are connected or attached to the substrate while the resonator body, including the compound spring structure and the mass, is suspended above the substrate.

As thus configured, the compound spring MEMS resonator 70 realizes increased electrode area with lowered effective impedance. In particular, the first and second masses 74*a,b* form a large electrode area for capacitive coupling to the drive electrode 66 and the sense electrode 68, respectively. In particular, the mass 74*a* at the first open end of the multiple parallely connected resonator units is capacitively coupled to the drive electrode 66 to receive the input drive signal while the mass 74*b* at the second open end of the multiple parallely connected resonator units is capacitively coupled to the sense electrode 68 to provide the output sense signal. That is, the drive electrode 66 is separated from the mass 74*a* by a narrow and well controlled gap so that the drive electrode 66 and the mass 74*a* form a capacitor. Similarly, the sense electrode 68 is separated from the mass 74*b* by a narrow and well controlled gap so that the sense electrode 66 and the mass 74*b* form a capacitor. A large electrode area is made possible by the parallel configuration of multiple resonator units. Furthermore, by having the resonator units thus connected in parallel, the resistance or motional impedance of the MEMS resonator is reduced, thereby improving the electrical characteristics of the MEMS resonator 70.

Accordingly, in some embodiments, the compound spring MEMS resonator of the present invention can be formed by selecting the desired number of spring unit cell for the compound spring block to tune the desired resonant frequency of the MEMS resonator and by selecting the desired number of parallel resonator units to adjust the desired electrical characteristics for the MEMS resonator. In particular, the resonant frequency of the MEMS resonator is tuned by the size (or dimension) and weight of the mass (mass 60a,b) and the stiffness of the spring which is determined by the number of spring unit cells and the dimensions of the spring unit cell, including the dimensions of the beams forming the spring unit cell. The impedance of the MEMS resonator is tuned by the number of parallely connected resonator units.

Figure 7:
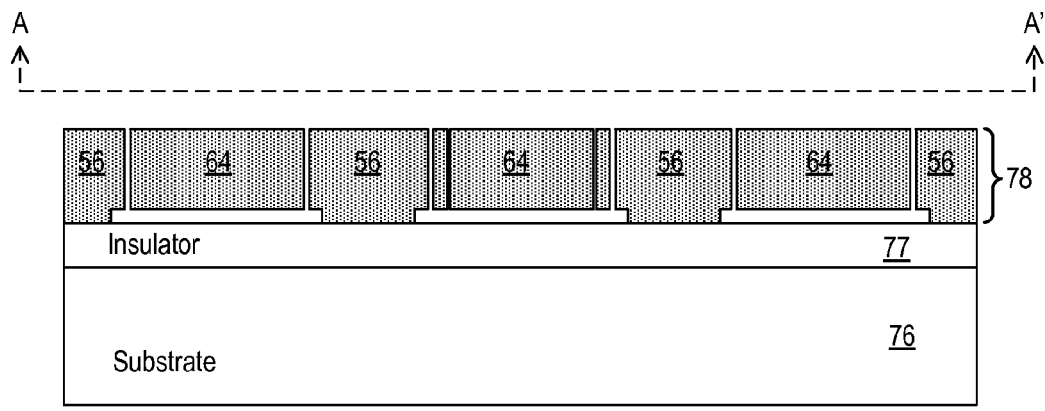
FIG. 7 is a cross-sectional view of the compound spring MEMS resonator of FIG. 6 along a line A-A' in some embodiments.

FIG. 7 is a cross-sectional view of the compound spring MEMS resonator of FIG. 6 along a line A-A' in some embodiments. Referring to FIG. 7, the MEMS resonator 70 is formed on a substrate including a silicon base layer 76 and an insulator layer 77, such as silicon oxide, formed on the base layer 76. The resonator structure is formed in a silicon layer 78, such as a single crystalline or polycrystalline silicon layer. The silicon layer 78 may be 20-30 μm thick. The silicon layer 78 is patterned lithographically and then etched, such as a wet etch using hydrofluoric acid, to release the spring structure. The anchors 56, being a large silicon structure, remain attached to the insulating layer 77 as the undercutting from the wet etch is not sufficient to etch through the anchors.

Figure 8:
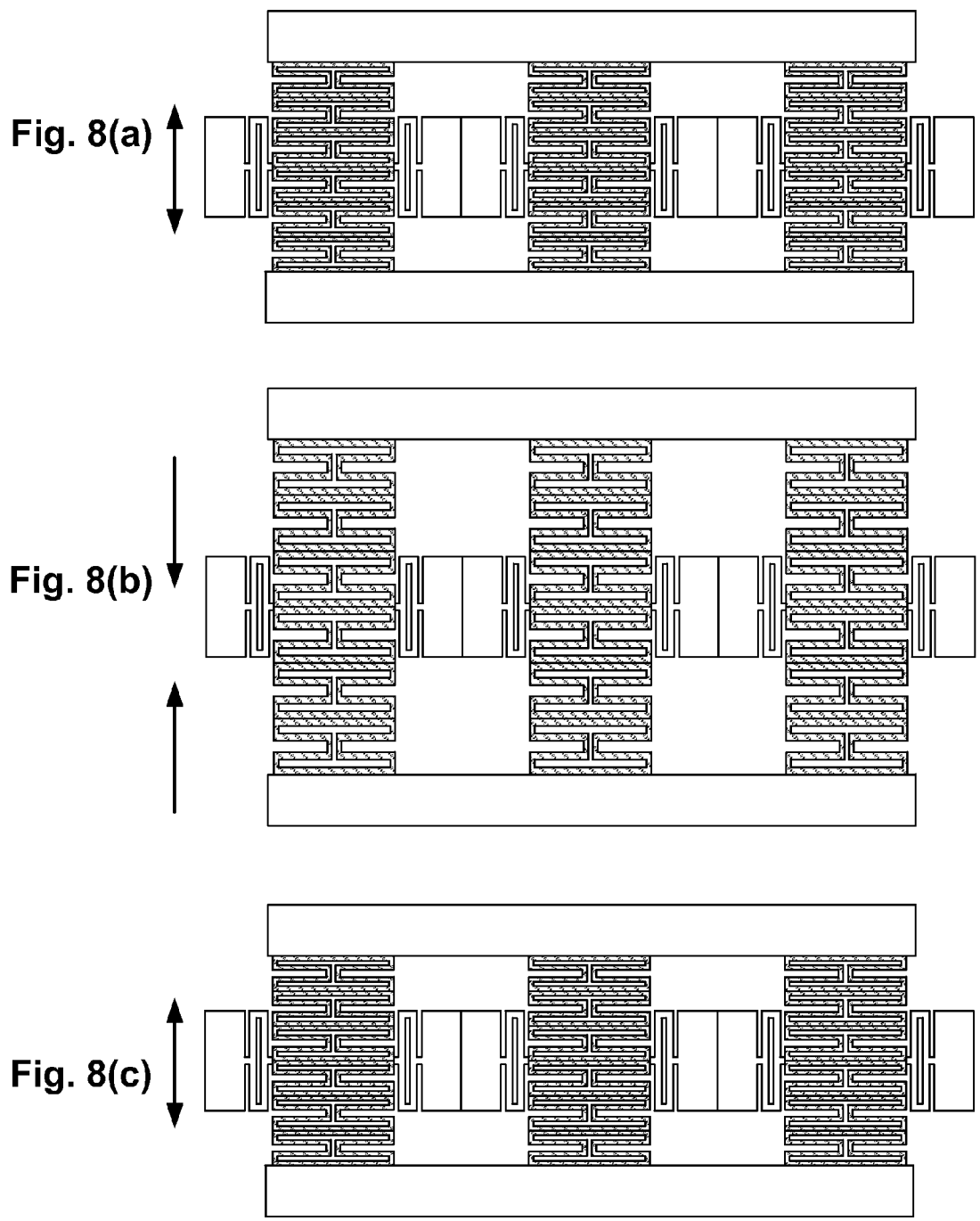
FIG. 8, which includes

FIG. 8, which includes FIGS. 8(a) to 8(c), illustrates the harmonic motion of the MEMS resonator of FIG. 6 in some examples. The displacement shown in FIG. 8 is exaggerated for illustrative purpose. In actual practice, the movement of the MEMS resonator is small and remains within the narrow air gap between the mass and the drive/sense electrodes. For example, when the air gap is 1 μm, the spring structure of the MEMS resonator has a displacement of less than 1 μm. The operation of the MEMS resonator 70 will be described with reference to FIGS. 6 and 8.

In embodiments of the present invention, the MEMS resonator 70 is electrostatically driven and sensed. To actuate the MEMS resonator, a DC voltage and a small AC signal is applied to the drive electrode 66. The mass 74a is then driven capacitively through the air gap by the drive electrode 66. As a result of the drive voltage, the compound spring block vibrates. More specifically, the compound spring structure in the MEMS resonator starts from a first position (FIG. 8(a)) and expands outward (or stretches) to push the mass at the two ends towards the drive/sense electrodes (not shown), as shown in FIG. 8(b). With the compound spring structure stretched to the maximum amplitude, the compound spring structure returns to the first position, as shown in FIG. 8(c). The harmonic motion of the compound spring structure repeats at the resonant frequency as the MEMS resonator 70 is being driven. At the nodal points where the anchor is attached to the compound spring structures, the compound spring structure does not move during the vibrational movement.

The displacement of the mass 74b relative to the sense electrode 68 alters the capacitance of the capacitor formed between the two electrodes. A time varying capacitor is formed between the mass 74b and the sense electrode 68. To sense the capacitance change, a DC voltage is applied between the resonator structure and the sense electrode 68 and an AC current, indicative of the capacitance changes, is generated. The AC current at the sense electrode is sensed to generate the sense signal having a precise frequency. In some embodiments, the MEMS resonator 70 is tuned to a resonant frequency of 32.768 kHz or some multiple of 32.768 kHz. The MEMS resonator 70 can be used to construct a MEMS oscillator providing an output frequency of 32.768 kHz which is useful in real-time clock circuits.

Figure 9:
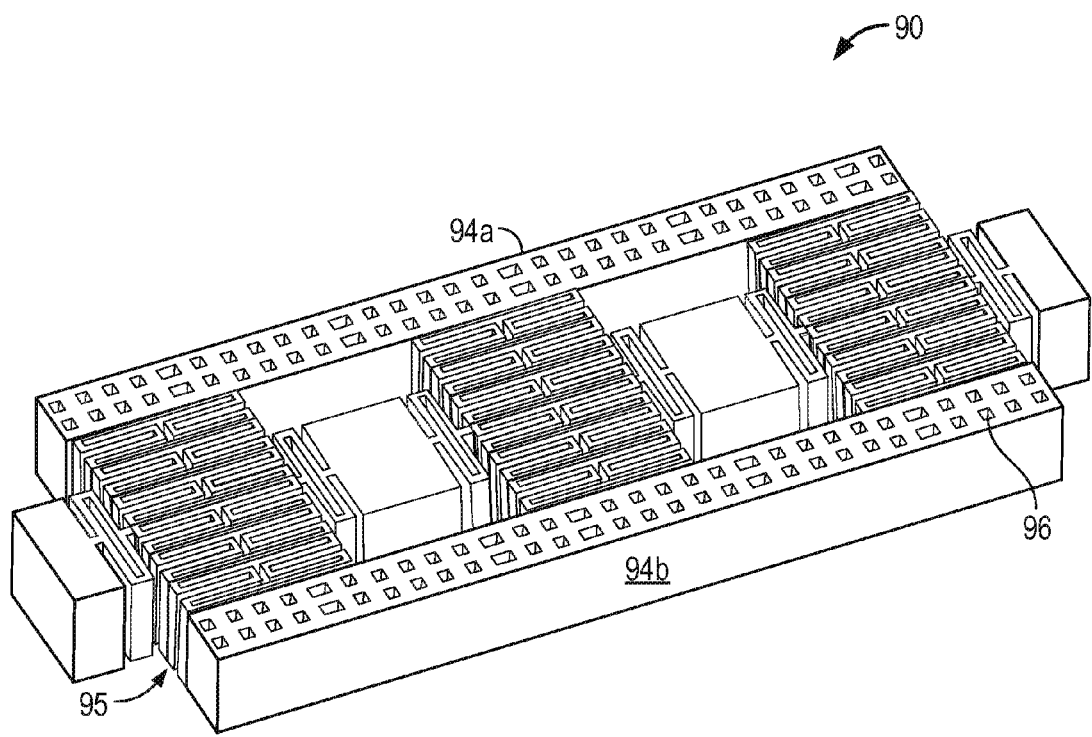
FIG. 9 is a perspective view of a compound spring MEMS resonator including release holes in alternate embodiments of the present invention.

FIG. 9 is a perspective view of a compound spring MEMS resonator including release holes in alternate embodiments of the present invention. Referring to FIG. 9, a MEMS resonator 90 is constructed in the same manner as MEMS resonator 70 of FIG. 5 but with the addition of release holes 96 in the mass 94a and 94b at the open ends of the compound spring block 95. The release holes 96 are used to adjust the weight of the mass 94a, 94b while also facilitate ease of fabrication. In particular, the weight of mass 94a and 94b can be tuned by including an arrangement of release holes 96 in the structure of the mass. Adjusting the weight of the mass 94a and 94b adjusts the weight of the resonator body which in turn tunes the resonant frequency of the MEMS resonator. Furthermore, the release holes 96 enhance the wet etch process to release the resonator body by providing additional openings for the etchant to enter to etch under the resonator structure, thereby enhancing the etching process and ensuring the release of the resonator structure. The number, the size and the position of the release holes 96 can be selected to both adjust the weight of the mass to tune the resonant frequency and to enhance the etching of the structure during fabrication. The arrangement of the release holes in FIG. 9 is illustrative only.

The compound spring MEMS resonator of the present invention realizes many advantages over conventional MEMS resonators. First, the compound spring MEMS resonator of the present invention can realize a compact size for low frequency as compared to conventional MEMS resonators. Second, the compound spring MEMS resonator of the present invention can realize relatively low motional impedance which is a key parameter when the resonator is applied to construct timing or clock circuits, such as real-time clocks. Third, the compound spring MEMS resonator of the present invention has symmetric resonant mode shape and has anchors attached to nodal points of the resonant body. Accordingly, the compound spring MEMS resonator of the present invention can achieve low loss and high quality factor.

Multiple Coil Spring MEMS Resonator

Figure 10:
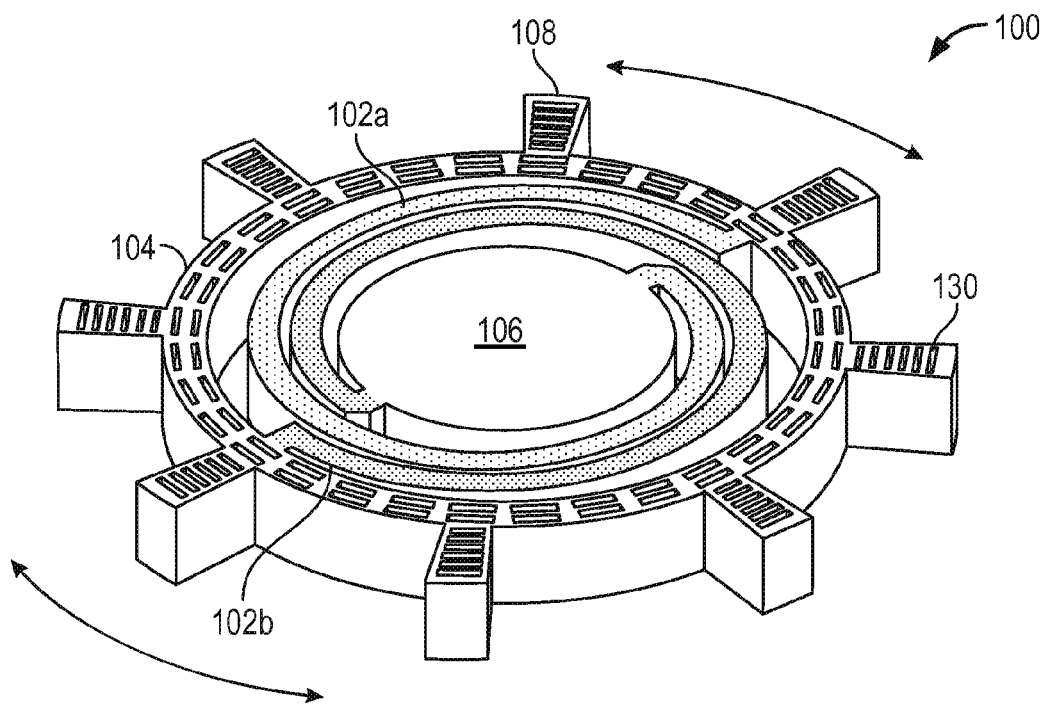
FIG. 10 is a perspective view of a multiple coil spring MEMS resonator in embodiments of the present invention.

FIG. 10 is a perspective view of a multiple coil spring MEMS resonator in embodiments of the present invention. Referring to FIG. 10, a multiple coil spring MEMS resonator 100 includes a resonator body formed by one or more pairs of coil springs 102 and an outer closed ring 104 suspended above a substrate (not shown) and anchored to the substrate through a center anchor 106. The coil springs 102 extend in a spiral pattern from the center anchor 106 to the outer closed ring 104. Each pair of coil springs 102 originate from opposing points on the center anchor 106 and extend in a spiral pattern to opposing points on the outer ring structure 104. In FIG. 10 and the following figures, the coil springs of the MEMS resonator are shown in a different hatch pattern to illustrate the coil spring structure.

More specifically, in the present embodiment, a first coil spring 102a originates from a first position on the center anchor and extends in a spiral pattern for a full circle around the center anchor 106 to terminate on the outer ring 104 at a position aligned with the first position. The second coil spring 102b originates from a second position on the center anchor that is opposite the first position. The second coil spring 102b extends in a spiral pattern for a full circle around the center anchor 106 to terminate on the outer ring 104 at a position aligned with the second position. In embodiments of the present invention, the coil springs 102 can spiral in a clockwise direction or counter-clockwise direction from the center anchor to the output closed ring. A feature of the MEMS resonator of the present invention is the use of long coil springs in the resonator body where the long coil springs provide low spring constant in a very small area. In the present embodiment, the coil springs extend in a spiral pattern in a full circle around the center anchor. In other embodiments, the coil spring may spiral in a partial circle around the center anchor. Furthermore, in other embodiments, the coil spring may spiral around the center anchor for greater than a full circle.

The resonator body of MEMS resonator 100 further includes a set of electrodes 108 attached to the outer ring structure 104 and extending outward from the outer ring 104. In some embodiments, the electrodes 108 are formed perpendicular to the outer ring. The electrodes 108 functions as transducers to couple the drive and sense signals to and from the resonator body. In the present embodiment, eight transducers 108 are shown. In other embodiments, any number of one or more transducers 108 may be incorporated. The use of eight transducers in the present embodiment is illustrative only and not intended to be limiting.

In MEMS resonator 100, the number of the pairs of coil springs 102, the length and width of the coil springs 102, and the weight of the outer closed ring 104 are selected to realize the desired resonant frequency. In the embodiment shown in FIG. 10, the outer closed ring 104 and the electrodes 108 are formed with release holes 130. Release holes 130 can be used to adjust the weight of the outer ring and the electrodes so as to tune the resonant frequency of the MEMS resonator. The releases holes 130 also function to facilitate the etching and release of the resonator body from the underlying substrate during the manufacturing process.

In alternate embodiments, the outer ring 104 may incorporate structures other than release holes to adjust the mass and therefore adjust the resonance frequency. The structures on the external ring can be trimmed electrically or by laser to adjust the resonator frequency without affecting the quality factor of the MEMS resonator In one embodiment, the weight of the outer ring 104 and the number of pairs and the length and width of the coil springs 102 are selected so that the MEMS resonator 100 functions as a low frequency resonator. For example, in one embodiment, the MEMS resonator 100 is configured for a resonant frequency of 32.768 kHz or some multiple of 32.768 kHz, suitable for timing application or real-time clocks.

In some embodiments, the MEMS resonator 100 is formed by patterning and etching a silicon layer having a thickness of 20-30 µm. Thus, the MEMS resonator 100 has a thickness of approximately 20-30 µm. The center anchor has a diameter of 92 µm. The outer ring has an inner diameter of 187 µm and a width of 12 µm. The coil spring has a width of 8.5 µm and a length that is greater than the circumference of the center anchor and can be less than or greater than the inner circumference of the outer ring. The resulting resonant frequency of the coil spring resonator is approximately 64 kHz.

In embodiments of the present invention, the MEMS resonator 100 is formed using a conductive material such as polysilicon or single crystalline silicon. Furthermore, in some embodiments, the MEMS resonator of the present invention can be formed using standard CMOS fabrication processes. In some embodiments, the MEMS resonator is formed on a silicon-on-insulator (SOI) wafer. That is, the MEMS resonator is formed in a silicon layer formed on a substrate with an insulating layer formed thereon. For example, in one embodiment, a silicon base layer with 2 µm of silicon oxide formed thereon may be used as the substrate. The silicon layer, which can be a polysilicon layer or single crystalline silicon layer, is formed on the substrate and the silicon layer is patterned to form the MEMS resonator.

In some embodiments, the resonator body can be formed by having the resonator structure lithographically patterned on the silicon layer formed on the substrate. In some embodiments, the silicon layer is a single crystalline silicon layer and has a thickness of 20-30 µm. The silicon layer is patterned with the resonator structure, including the coil spring, the outer ring, and the center anchor. Then, the silicon layer is etched, such as using a wet etch process using hydrofluoric acid, to release the resonator coil spring and closed ring structure except the anchors. After the etch process, the resonator body is released from the underlying substrate while the center anchor remain attached to the substrate. As shown in FIG. 10, release holes 130 can be included in the outer ring 104 to facilitate the etching and release of the resonator body. The release holes also enable the weight of the mass to be adjusted to tune the resonant frequency, as explained above.

Figure 11:
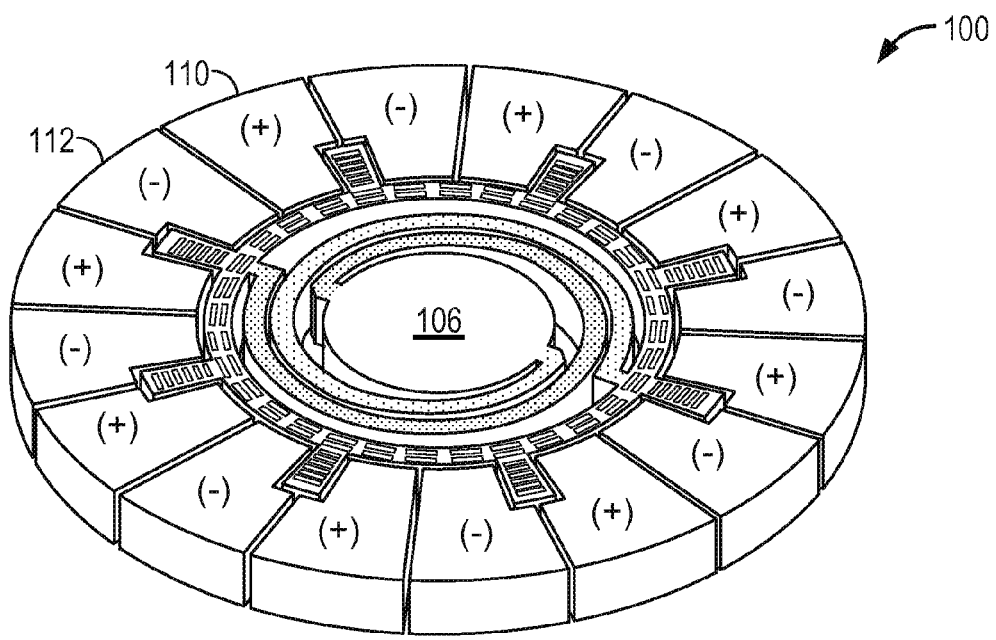
FIG. 11 is a perspective view of the multiple coil spring MEMS resonator of FIG. 10 incorporating drive and sense electrodes in embodiments of the present invention.
Figure 12:
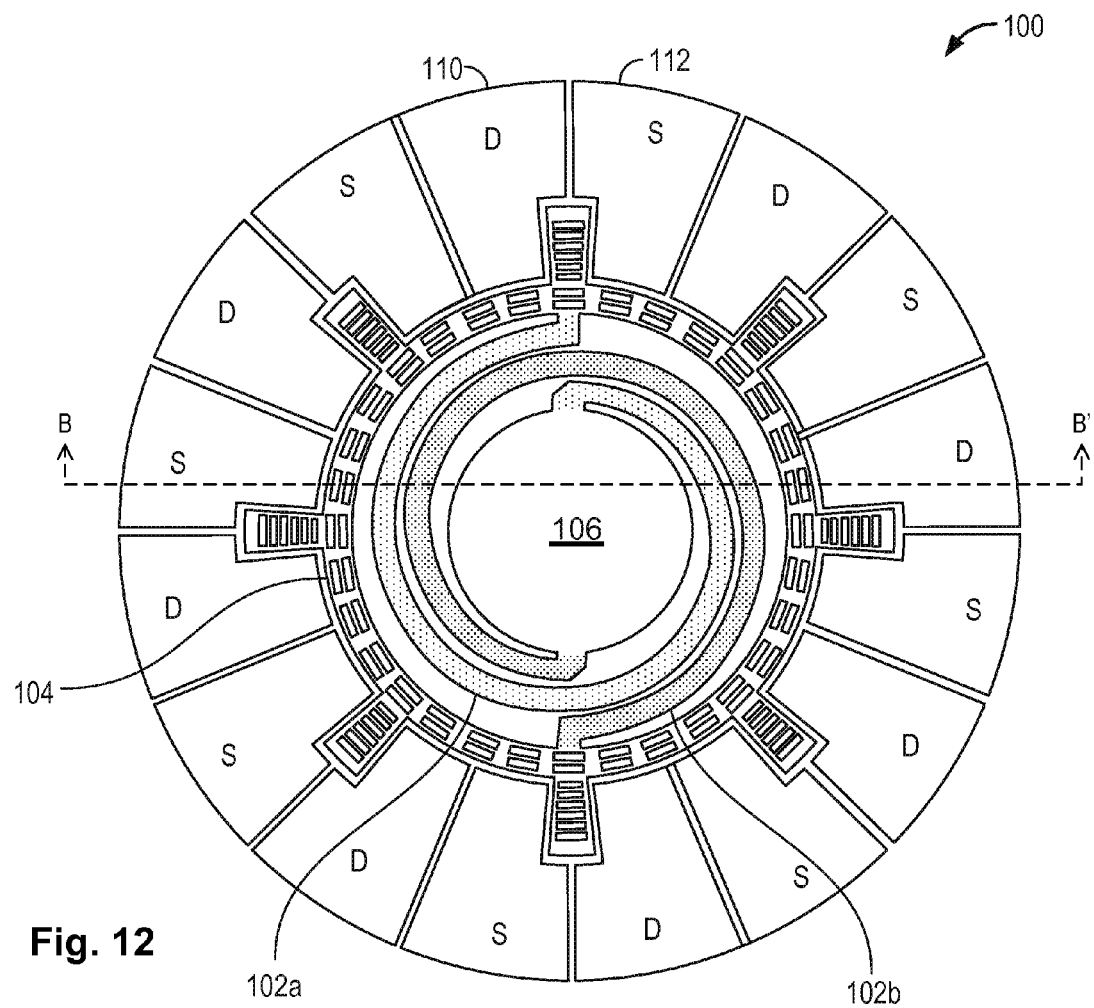
FIG. 12 is a top view of the multiple coil spring MEMS resonator of FIG. 11 in some embodiments.

In embodiments of the present invention, the MEMS resonator 100 is operated based on electrostatic transduction. The electrodes 108 extending from the outer ring 104 form transducers for coupling to the drive and sense electrodes. In some embodiments, the transducers can be configured for electrostatic comb drive. In other embodiments, the transducers can be configured for electrostatic parallel plate drive. FIG. 11 is a perspective view of the multiple coil spring MEMS resonator of FIG. 10 incorporating drive and sense electrodes in embodiments of the present invention. FIG. 12 is a top view of the multiple coil spring MEMS resonator of FIG. 11 in some embodiments. Referring to FIGS. 11 and 12, in the present embodiment, the transducers 108 of the MEMS resonator 100 are configured for parallel plate drive. Each transducer 108 is coupled to a set of drive electrode 110 and sense electrode 112. In the present example, the MEMS resonator 100 includes eight transducers 108. Therefore, a set of 16 drive/sense electrodes 110, 112 is provided for excitation of the MEMS resonator.

Each pair of drive/sense electrodes are capacitively coupled to a respective transducer 108. Each transducer is separated by a narrow and well controlled gap with the drive electrode and the sense electrode where the drive/sense electrodes are connected or attached to the substrate. The gap between the drive/sense electrodes and the transducer is typically a small air gap, on the order of 1 µm or less. Through the electrostatic transduced action, the MEMS resonator is driven into resonant vibration. In particular, the coil springs and the outer ring rotate in clockwise and counter-clockwise directions. The displacement of the resonator body is less than the air gap, such as less than half of 1 µm. The resonant vibration is sensed and converted into an electrical signal having a well-defined and precise frequency. Note that the resonator structure and the electrodes are symmetrical and therefore the drive and sense electrodes can be interchanged.

In embodiments of the present invention, the drive electrodes 110 can be driven with a DC voltage and an AC signal having the same phase. In other embodiments, the drive electrodes 110 can be driven with a DC voltage and an AC signal in different phases.

Figure 13:
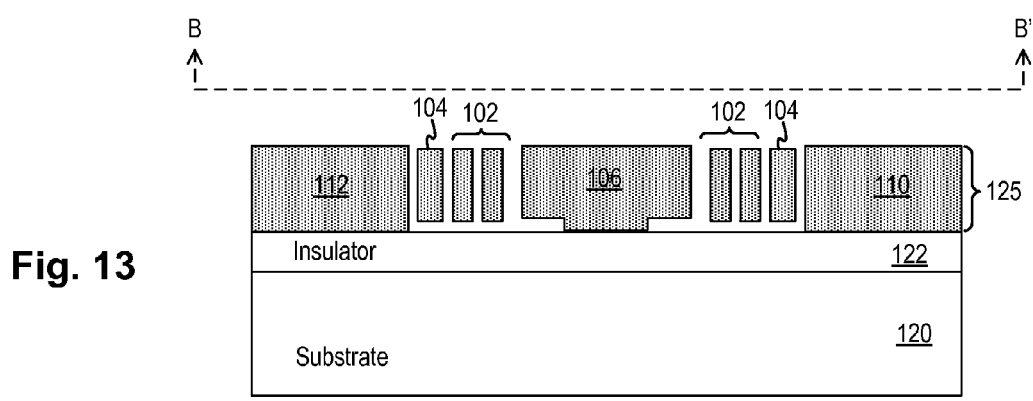
FIG. 13 is a cross-sectional view of the multiple coil spring MEMS resonator of FIG. 12 along a line B-B' in some embodiments.

FIG. 13 is a cross-sectional view of the multiple coil spring MEMS resonator of FIG. 12 along a line B-B' in some embodiments. Referring to FIG. 13, the MEMS resonator 100 is formed on a substrate including a silicon base layer 120 and an insulator layer 122, such as silicon oxide, formed on the base layer 120. The resonator structure is formed in a silicon layer 125, such as a single crystalline or polycrystalline silicon layer. The silicon layer 125 may be 20-30 μm thick. The silicon layer 125 is patterned lithographically and then etched, such as a wet etch using hydrofluoric acid, to release the coil spring structure. The center anchor 106, being a large silicon structure, remains attached to the insulating layer 122 as the undercutting from the wet etch is not sufficient to etch through the anchors. The coil springs 102 and the outer ring 104 are suspended from the underlying substrate. The drive and sense electrodes 110 and 112 remain connected to the substrate.

FIG. 14, which includes FIGS. 14(a) to 14(b), illustrates the harmonic motion of the MEMS resonator of FIG. 10 in some examples. The displacement shown in FIG. 14 is exaggerated for illustrative purpose. In actual practice, the movement of the MEMS resonator is small and remains within the narrow air gap between the transducer and the drive/sense electrodes. For example, when the air gap is 1 μm, the coil spring and outer ring structure of the MEMS resonator has a displacement of less than 1 μm and is typically on the order of half a micron. The operation of the MEMS resonator 100 will be described with reference to FIGS. 12 and 14.

In embodiments of the present invention, the MEMS resonator 100 is electrostatically driven and sensed. To actuate the MEMS resonator, a DC voltage and a small AC signal is applied to the drive electrode 110. The transducer 108 is then driven capacitively through the air gap by the drive electrode 110. As a result of the drive voltage, the coil spring and the outer ring rotate in a clockwise direction. More specifically, the coil spring and outer ring structure in the MEMS resonator starts from a first position (FIG. 14(a)) and rotates in a clockwise direction to a second position, as shown in FIG. 14(b). With the coil spring and outer ring structure thus rotated, the coil spring and outer ring structure rotates in a counter-clockwise direction back to the first position, as shown in FIG. 14(a). The harmonic motion of the coil spring and outer ring structure repeats at the resonant frequency as the MEMS resonator 100 is being driven. At the points where the coil springs are attached to the center anchor, the coil spring structure does not move during the vibrational movement.

The displacement of the transducer 108 relative to the sense electrode 112 alters the capacitance of the capacitor formed between the two electrodes. A time varying capacitor is formed between the transducer 108 and the sense electrode 112. To sense the capacitance change, a DC voltage is applied between the resonator structure and the sense electrode 112 and an AC current, indicative of the capacitance changes, is generated. The AC current at the sense electrode is sensed to generate the sense signal having a precise frequency. In some embodiments, the MEMS resonator 100 is tuned to a resonant frequency of 32.768 kHz or some multiple of 32.768 kHz. The MEMS resonator 100 can be used to construct a MEMS oscillator providing an output frequency of 32.768 kHz which is useful in real-time clock circuits.

It is instructive to note that the MEMS resonator 100 has a symmetrical resonator structure and therefore the drive and sense electrodes can be interchanged. Furthermore, the coil spring and outer ring structure can rotate from counter-clockwise direction to clockwise direction and then repeats. The order of the clockwise and counter-clockwise rotation is not critical to the practice of the present invention.

Figure 15:
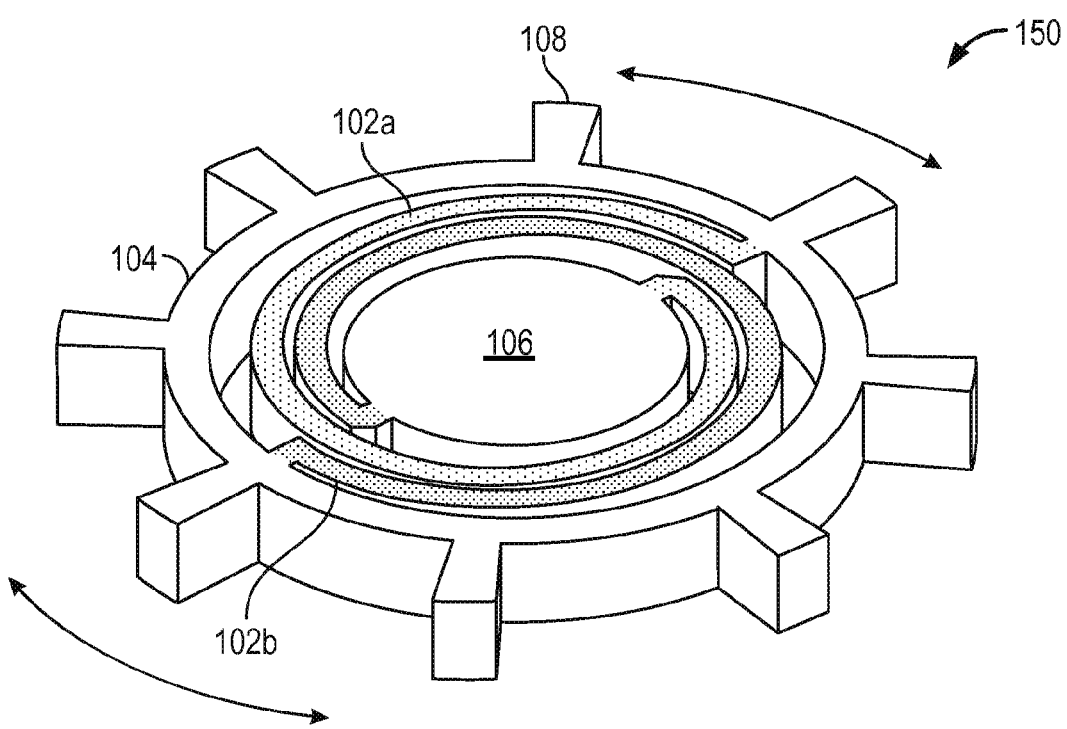
FIG. 15 is a perspective view of a multiple coil spring MEMS resonator without release holes in alternate embodiments of the present invention.

FIG. 15 is a perspective view of a multiple coil spring MEMS resonator without release holes in alternate embodiments of the present invention. Referring to FIG. 15, a MEMS resonator 150 is constructed in the same manner as MEMS resonator 100 of FIG. 10 but without any release holes. The multiple coil spring MEMS resonator of the present invention can be formed using release holes as shown in FIG. 10 to adjust the weight of the outer ring and the transducers. However, the release holes are optional. In the embodiment shown in FIG. 15, the multiple coil spring MEMS resonator can be formed without release holes. In other embodiments, the multiple coil spring MEMS resonator can be formed with release holes in the outer ring but not on the transducers. In yet other embodiments, the multiple coil spring MEMS resonator can be formed with release holes in the transducers but not on the outer ring.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A MEMS resonator comprising:
a resonator body comprising a first spring-mass section and a second spring-mass section, each spring-mass section comprising a compound spring structure having a base end and an open end and a mass attached to the open end of the compound spring structure, the first and second spring-mass sections being connected at the base ends which form a pair of nodal points of minimum movement of the resonator body during resonant vibration of the resonator body, wherein the compound spring structure is formed from one or more spring unit cells and each spring unit cell comprises a folded spring structure including a pair of end sections connected to a pair of folded inner sections forming opposing concave structures;
a pair of anchors connected to a substrate and attached to opposite sides of the resonator body at the nodal points;
a drive electrode formed attached to the substrate and capacitively coupled to the mass of the first spring-mass section; and
a sense electrode formed attached to the substrate and capacitively coupled to the mass of the second spring-mass section.

2. The MEMS resonator of claim 1, further comprising:
a pair of suspension beams suspended above the substrate, each anchor being attached to the resonator body at the nodal point through one of the suspension beams.

3. The MEMS resonator of claim 1, wherein the drive electrode and the mass of the first spring-mass section is separated by a first gap and the sense electrode and the mass of the second spring-mass section is separated by a second gap, each of the first and second gaps being equal to or less than 1 μm.

4. The MEMS resonator of claim 1, wherein the resonator body has a thickness of 20-30 μm.

5. The MEMS resonator of claim 1, wherein the resonator body is formed from a material selected from a single crystalline silicon layer and a polycrystalline silicon layer.

6. The MEMS resonator of claim 1, wherein the substrate comprises a silicon base layer on which an insulating layer is formed.

7. The MEMS resonator of claim 1, wherein the spring unit cell comprises a rectangular folded spring structure.

8. The MEMS resonator of claim 1, wherein the mass attached to the open end of the compound spring structure in each spring-mass section comprises release holes formed therein, the release holes adjusting the weight of the mass.

9. The MEMS resonator of claim 1, wherein dimensions of the spring unit cell, including the dimensions of beams forming the folded spring structure, a number of spring unit cells in the compound spring structure and a size and a weight of the mass in each spring-mass section are selected to tune a resonant frequency of the MEMS resonator.

10. A MEMS resonator comprising:
a resonator body comprising one or more resonator units, each resonator unit comprising:
a first spring-mass section and a second spring-mass section, each spring-mass section comprising a compound spring structure having a base end and an open end and a mass attached to the open end of the compound spring structure, the first and second spring-mass sections being connected at the base ends which form a pair of nodal points of minimum movement of the resonator unit during resonant vibration of the resonator unit, wherein the compound spring structure is formed from one or more spring unit cells and each spring unit cell comprises a folded spring structure including a pair of end sections connected to a pair of folded inner sections forming opposing concave structures; and
a pair of anchors connected to a substrate and attached to opposite sides of the resonator unit at the nodal points,
wherein the masses of the first spring-mass sections of the one or more resonator units are formed as a continuous structure to form a first mass, and the masses of the second spring-mass sections of the one or more resonator units are formed as a continuous structure to form a second mass, the first mass and the second mass being formed to connect the resonator units in parallel;
a drive electrode formed attached to the substrate and capacitively coupled to the first mass; and
a sense electrode formed attached to the substrate and capacitively coupled to the second mass.

11. The MEMS resonator of claim 10, wherein each resonator unit further comprises:
a pair of suspension beams suspended above the substrate, each anchor being attached to the resonator unit at the nodal point through one of the suspension beams.

12. The MEMS resonator of claim 10, wherein the drive electrode and the first mass is separated by a first gap and the sense electrode and the second mass is separated by a second gap, each of the first and second gaps being equal to or less than 1 µm.

13. The MEMS resonator of claim 10, wherein the resonator body has a thickness of 20-30 µm.

14. The MEMS resonator of claim 10, wherein the resonator body is formed from a material selected from a single crystalline silicon layer and a polycrystalline silicon layer.

15. The MEMS resonator of claim 10, wherein the substrate comprises a silicon base layer on which an insulating layer is formed.

16. The MEMS resonator of claim 10, wherein the spring unit cell comprises a rectangular folded spring structure.

17. The MEMS resonator of claim 10, wherein the first mass and the second mass each comprises release holes formed therein, the release holes adjusting the weight of the first or second mass.

18. The MEMS resonator of claim 10, wherein dimensions of the spring unit cell, including the dimensions of beams forming the folded spring structure, a number of spring unit cells in the compound spring structure and a size and a weight of the mass in each spring-mass section are selected to tune a resonant frequency of the MEMS resonator.

19. The MEMS resonator of claim 10, wherein a number of resonant units in the resonator body is selected to obtain a desired electrical characteristic of the MEMS resonator.

20. The MEMS resonator of claim 19, wherein the number of resonant units in the resonator body is selected to obtain a desired motional impedance of the MEMS resonator.

* * * * *